United States Patent
Tsukamoto

(10) Patent No.: US 7,800,444 B2
(45) Date of Patent: Sep. 21, 2010

(54) CLASS D AMPLIFIER

(75) Inventor: Akihito Tsukamoto, Kanagawa (JP)

(73) Assignee: Panasonic Corporation, Osaka (JP)

( * ) Notice: Subject to any disclaimer, the term of this patent is extended or adjusted under 35 U.S.C. 154(b) by 36 days.

(21) Appl. No.: 12/332,689

(22) Filed: Dec. 11, 2008

(65) Prior Publication Data

US 2009/0153243 A1    Jun. 18, 2009

(30) Foreign Application Priority Data

Dec. 12, 2007    (JP)    ............... 2007-321176

(51) Int. Cl.
*H03F 3/217*    (2006.01)
(52) U.S. Cl. ..................... 330/251; 330/10
(58) Field of Classification Search ............. 330/10, 330/251, 207 A; 375/238; 370/212; 332/109
See application file for complete search history.

(56) References Cited

U.S. PATENT DOCUMENTS 6,586,991 B2    7/2003    Masuda et al.
6,917,242 B2 *    7/2005    Masuda et al. ................ 330/10
7,167,046 B2    1/2007    Maejima
7,538,611 B2 *    5/2009    Chen et al. .................. 330/251

FOREIGN PATENT DOCUMENTS

JP    2006-115028 A    4/2006

OTHER PUBLICATIONS

English language Abstract of JP 2006-115028 A (Apr. 27, 2006).

* cited by examiner

*Primary Examiner*—Hieu P Nguyen
(74) *Attorney, Agent, or Firm*—Greenblum & Bernstein, P.L.C.

(57) ABSTRACT

A single-end-output class D amplifier handles a load, such as stereo headphones, without using an expensive part such as a crystal resonator or transformer. The class D amplifier is equipped with PWM (Pulse Width Modulation) circuits that perform pulse width modulation of an input signal and output two opposite-phase PWM outputs, PWM output buffers that amplify differential outputs of PWM circuits using a power supply voltage, and inductors that combine PWM outputs amplified by the PWM output buffers.

2 Claims, 11 Drawing Sheets

US 7,800,444 B2

CLASS D AMPLIFIER

CROSS REFERENCE TO RELATED APPLICATIONS

The disclosure of Japanese Patent Application No. 2007-321176 filed on Dec. 12, 2007 including the specification, drawings and abstract is incorporated herein by reference in its entirety.

BACKGROUND OF THE INVENTION

1. Field of the Invention

The present invention relates to a class D amplifier that performs digital modulation and power amplification of an input PWM (Pulse Width Modulation) signal, and more particularly to a single-end-output class D amplifier that drives a load with one terminal grounded, as in the case of stereo headphones.

2. Description of the Related Art

Class D amplifiers are widely used as speaker drive amplifiers due to the fact that they feature extremely good power conversion efficiency, and thus a low level of heat discharge, compared with an analog linear amplifier such as a class A or B amplifier. A class D amplifier is implemented by performing switching operations by means of an amplification active element such as a transistor on an audio signal or suchlike input signal. A class D amplifier performs digital modulation of a PWM signal based on an input audio signal, performs power amplification of this PWM signal, and supplies the power amplified PWM signal to a speaker section.

A pulse modulation signal generation apparatus that prevents performance degradation due to harmonic distortion produced by PWM modulation in a fully digital amplifier is described in Patent Document 1 (Unexamined Japanese Patent Publication No. 2006-115028).

FIG. 1 is a drawing showing the configuration of a class D amplifier when driving stereo headphones.

In FIG. 1, class D amplifier 10 is configured by means of 8-fold oversampling circuits 11 and 12, ΔΣ modulation circuits 13 and 14, PWM circuits 15 and 16, level shifters (LS) 17, 18, and 23, D flip-flops 19 and 20, PWM output buffers 21 and 22, inductors 24 and 25, capacitors 26 through 29, 3-terminal connector 30, and stereo headphones 31. There are two of each configuration element in order to provide stereo output. To simplify the description, only one channel will be described. Operation is the same for both channels.

Input PCM data sampling frequency fs is increased 8-fold by 8-fold oversampling circuit 11.

ΔΣ modulation circuit 13 further increase the sampling frequency 2-fold, for a 16-fold increase in original sampling frequency fs. At the same time, requantization and noise shaping processing are performed.

PWM circuit 15 modulates M-ary output from ΔΣ modulation circuit 13 to a PWM wave. In this example, ΔΣ modulation circuit 13 is an M-ary output type, and requantizes to ±6—that is, 13—values. PWM circuit 15 generates a PWM wave such as shown in FIG. 2 according to this numeric value.

FIG. 2 is a drawing showing PWM circuit 15 output waveforms for ±6 values, and shows output steps that a PWM wave can take when the sampling rate is 16 fs.

Data of one sample is represented by 24 pulses of a clock signal. That is to say, the clock frequency is [384×fs].

As shown in FIG. 2, a PWM wave is at a high level for 24 clock pulses at ±6. At −6, the PWM wave is at a low level. At 0, the high-level period and low-level period are the same.

FIG. 3 shows signals at each of the above stages on the frequency axis.

FIG. 3 comprises drawings showing input PCM data, 8-fold oversampling, ΔΣ modulation circuit output, and a PWM wave on the frequency axis.

First, as shown in FIG. 3(a), modulation components up to [8×fs] above the first harmonic are eliminated by 8-fold oversampling of input PCM data.

Then, as shown in FIG. 3(b), ΔΣ modulation circuit 13 performs requantization and noise shaping processing by means of a [16×fs] sampling frequency. As a result, quantization noise is distributed with [8×fs] as a peak (see FIG. 3(c)).

PWM output buffer 21 is inserted in order to output a current capable of driving a load. PWM output buffer 21 output is at power supply voltage VDD at the high level and 0 V at the low level.

PWM output buffer 21 operates at power supply voltage VDD, unlike circuitry in the preceding stage. Therefore, PWM circuit 15 output is converted to a potential at which PWM output buffer 21 operates by means of level shifter 17. However, the waveform of a PWM wave may be disrupted by passage through level shifter 17. To prevent this, the PWM wave passes through D flip-flop 19. D flip-flop 19 operates at the same power supply voltage VDD as PWM output buffer 21, and therefore potential conversion is also performed for the clock in the same way as for the PWM wave by level shifter 23.

Inductor 24 and capacitor 26 form an LPF (Low Pass Filter).

FIG. 4 is a drawing showing a PWM waveform when ΔΣ modulation circuit 13 output is 0, and a waveform after passage through the LPF. As shown in FIG. 4, the high-level period and low-level period of a PWM wave are the same, and therefore the voltage after passage through the LPF is VDD/2.

Then stereo headphones 31 constituting the load are driven via capacitor 28 that cuts off direct current.

With typical stereo headphones, one side of the load is made common as ground. This enables the number of terminals of 3-terminal connector 30 to be kept to three.

However, a problem with a conventional class D amplifier of this kind is as follows.

One cause of degradation of class D amplifier performance is operating clock jitter.

FIG. 5 is a drawing explaining performance degradation of a class D amplifier due to operating clock jitter, showing a PWM waveform and voltage after passage through an LPF when ΔΣ modulation circuit 13 output is 0 in a case in which there is jitter in the operating clock. As shown in FIG. 5, when there is jitter in the operating clock, a perfect VDD/2 such as shown in FIG. 3 is not achieved, but instead noise is included.

To prevent this, a low-jitter clock source such as a crystal oscillation circuit is necessary.

However, a problem is that the crystal resonator of a crystal oscillation circuit is expensive in comparison with a part such as a resistor or capacitor.

Also, if there is a stable clock source of a different frequency, there is a method whereby a clock used by a class D amplifier is generated from that clock source using a PLL (Phase Locked Loop) circuit. However, since a low-jitter clock is necessary, as stated above, stringent performance requirements are imposed on the PLL circuit. This entails an increase in the operating power supply voltage of PLL circuit configuration elements such as a VCO (Voltage Controlled Oscillator) or charge pump.

Thus, with a class D amplifier that drives a load with one terminal grounded, such as stereo headphones, the use of an expensive part such as a crystal resonator has come to be a presupposition.

SUMMARY OF THE INVENTION

It is an object of the present invention to provide a single-end-output class D amplifier that handles a load such as stereo headphones without using an expensive part such as a crystal resonator or transformer.

It is another object of the present invention to provide a class D amplifier that enables an operating clock frequency to be halved, reduces power consumption, and facilitates unwanted emission countermeasures.

According to an aspect of the invention, a class D amplifier is equipped with a PWM circuit that performs PWM modulation of an input signal and outputs two opposite-phase PWM outputs, a plurality of buffers that amplify the two PWM outputs respectively using power supply voltage VDD, and a plurality of inductors that combine PWM outputs amplified by the plurality of buffers.

DETAILED DESCRIPTION OF THE PREFERRED EMBODIMENT

With reference now to the accompanying drawings, an embodiment of the present invention will be explained in detail below.

(Explanation of Principles)

First, the basic concept of the present invention will be explained.

A method can be conceived whereby clock jitter is canceled out by differentializing output.

Figure 7:
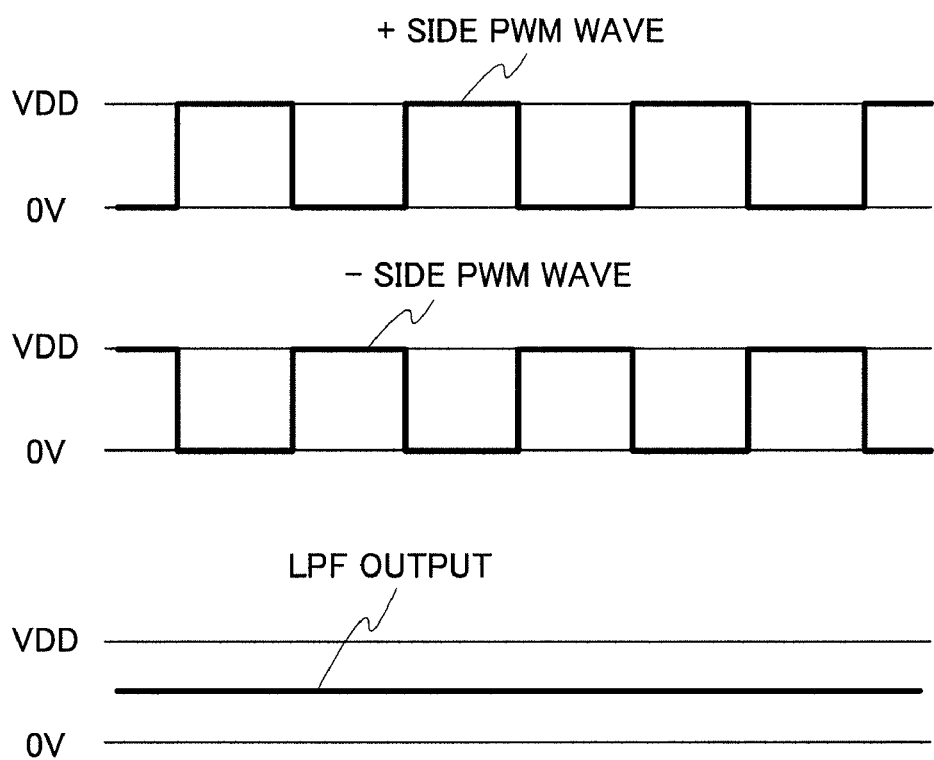
FIG. 7 is a drawing for an explanation of principles showing PWM waveforms and a waveform after passage through an LPF when there is no clock jitter of a class D amplifier.
Figure 8:
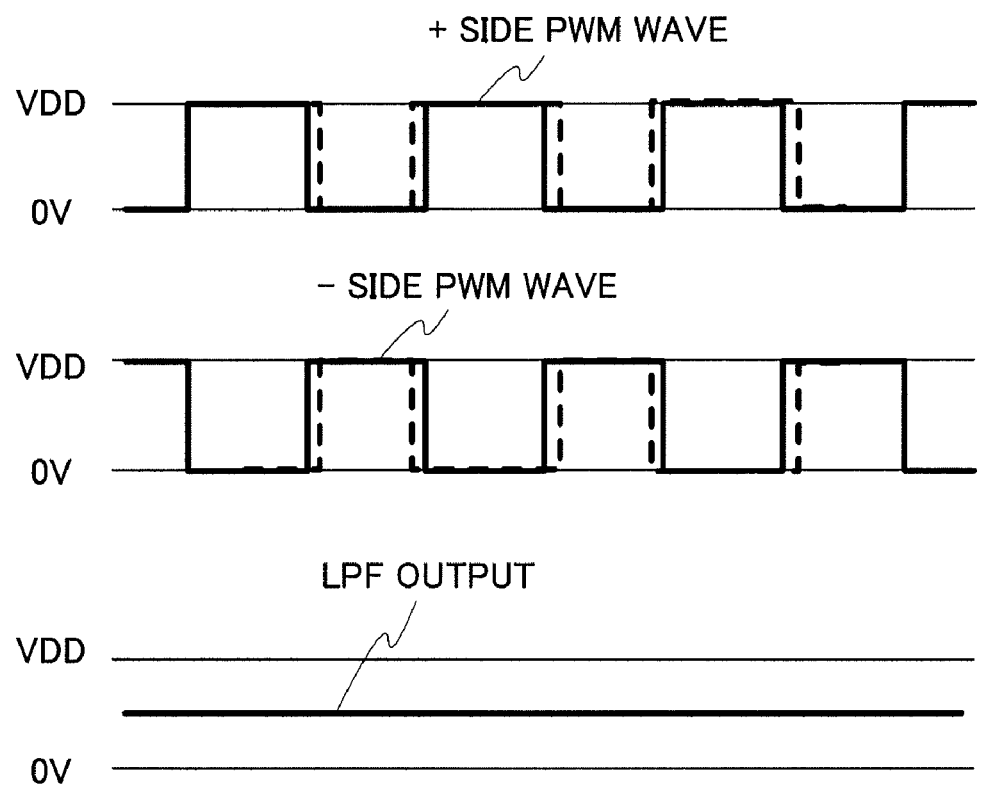
FIG. 8 is a drawing for an explanation of principles showing PWM waveforms and a waveform after passage through an LPF when there is clock jitter of a class D amplifier.

FIG. 7 is a drawing showing PWM waveforms and a waveform after passage through an LPF when there is no operating clock jitter. FIG. 8 is a drawing showing PWM waveforms and a waveform after passage through an LPF when there is operating clock jitter in FIG. 7. As shown in FIG. 8, even though there is operating clock jitter, this is mutually canceled out by the + side PWM wave and − side PWM wave, and therefore does not appear as noise.

However, in order to differentialize output, it is necessary to drive both 2-terminal loads. Therefore, this cannot be applied when one terminal is grounded and terminal sharing is implemented, as with headphones.

Figure 9:
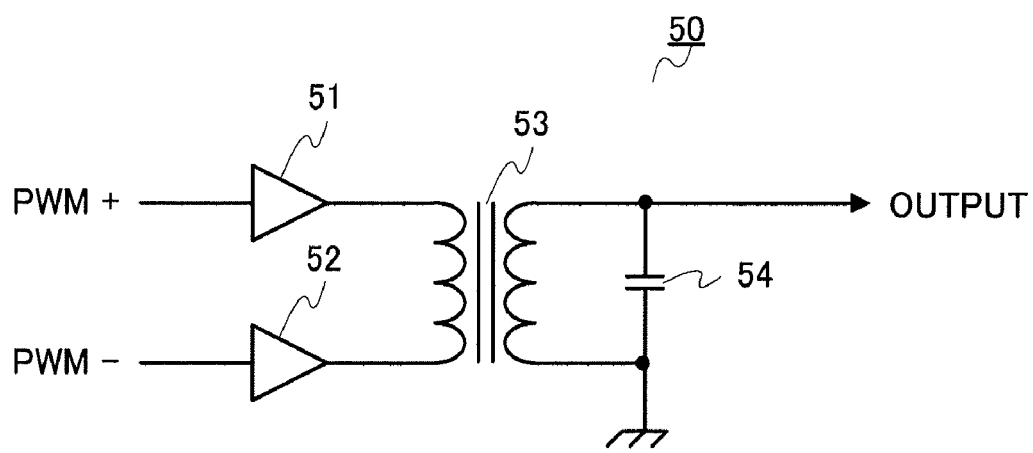
FIG. 9 is a drawing for an explanation of principles showing the configuration of a class D amplifier output stage that differentializes PWM output.

Thus, a method can be conceived whereby conversion to single-end output is performed using a transformer, as shown in FIG. 9.

FIG. 9 is a drawing showing the configuration of a class D amplifier output stage that differentializes PWM output.

In FIG. 9, class D amplifier output stage 50 is composed of + side PWM output buffer 51, − side PWM output buffer 52, transformer 53, and capacitor 54.

Transformer 53 converts output of + side PWM output buffer 51 and − side PWM output buffer 52 connected to the primary side to single-end output, and outputs this on the secondary side.

Capacitor 54 forms an LPF together with an inductor of a coil inside transformer 53.

An advantage of using transformer 53 is that, as well as differential output being converted to single-end output, an effect is obtained of cutting off the DC level, enabling a coupling capacitor to be omitted. However, unless a transformer with little internal loss in the PWM wave band is used, efficiency as a class D amplifier is greatly impaired. That is to say, there is a problem regarding the practicability of a transformer that achieves a desired frequency characteristic and permissible output power. Therefore, generating a stable clock by means of a crystal resonator is advantageous from a cost standpoint.

The present inventors hit upon the idea of combining differential outputs using two inductors instead of a transformer.

Figure 6:
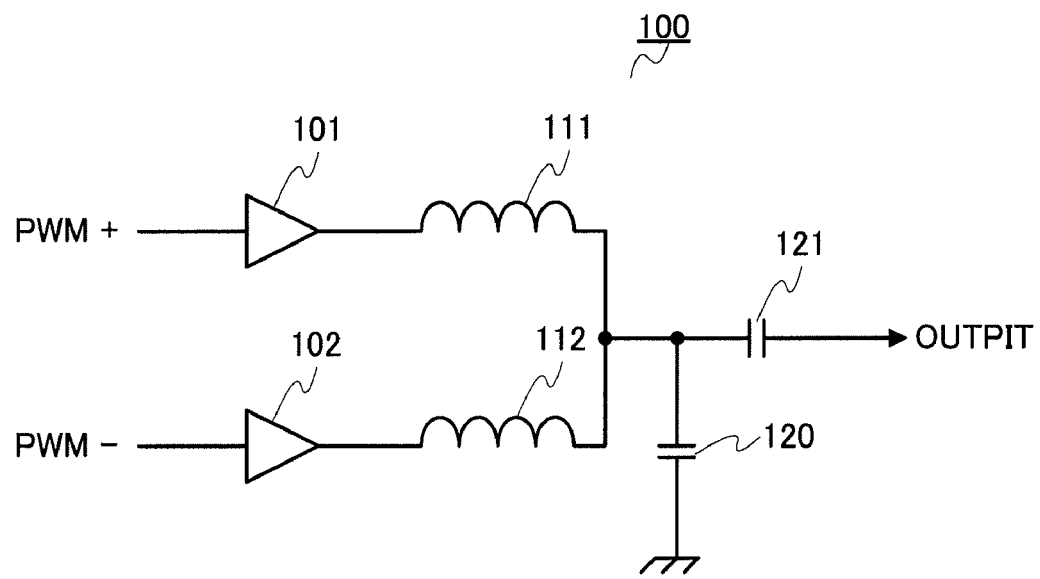
FIG. 6 is a drawing for an explanation of principles showing the configuration of a class D amplifier output stage that differentializes PWM output.

FIG. 6 is a drawing showing the configuration of a class D amplifier output stage that differentializes PWM output.

In FIG. 6, class D amplifier output stage 100 is configured by means of + side PWM output buffer 101, − side PWM output buffer 102, inductors 111 and 112, and capacitors 120 and 121.

Class D amplifier output stage 100 uses two inductors 111 and 112 instead of transformer 53 in FIG. 9, and combines differential outputs by combining positive and negative outputs by means of inductors 111 and 112.

By this means, jitter that may be present in a clock supplied to + side PWM output buffer 101, − side PWM output buffer 102, and so forth, is canceled out as shown in FIG. 8 and does not appear as noise.

Figure 10:
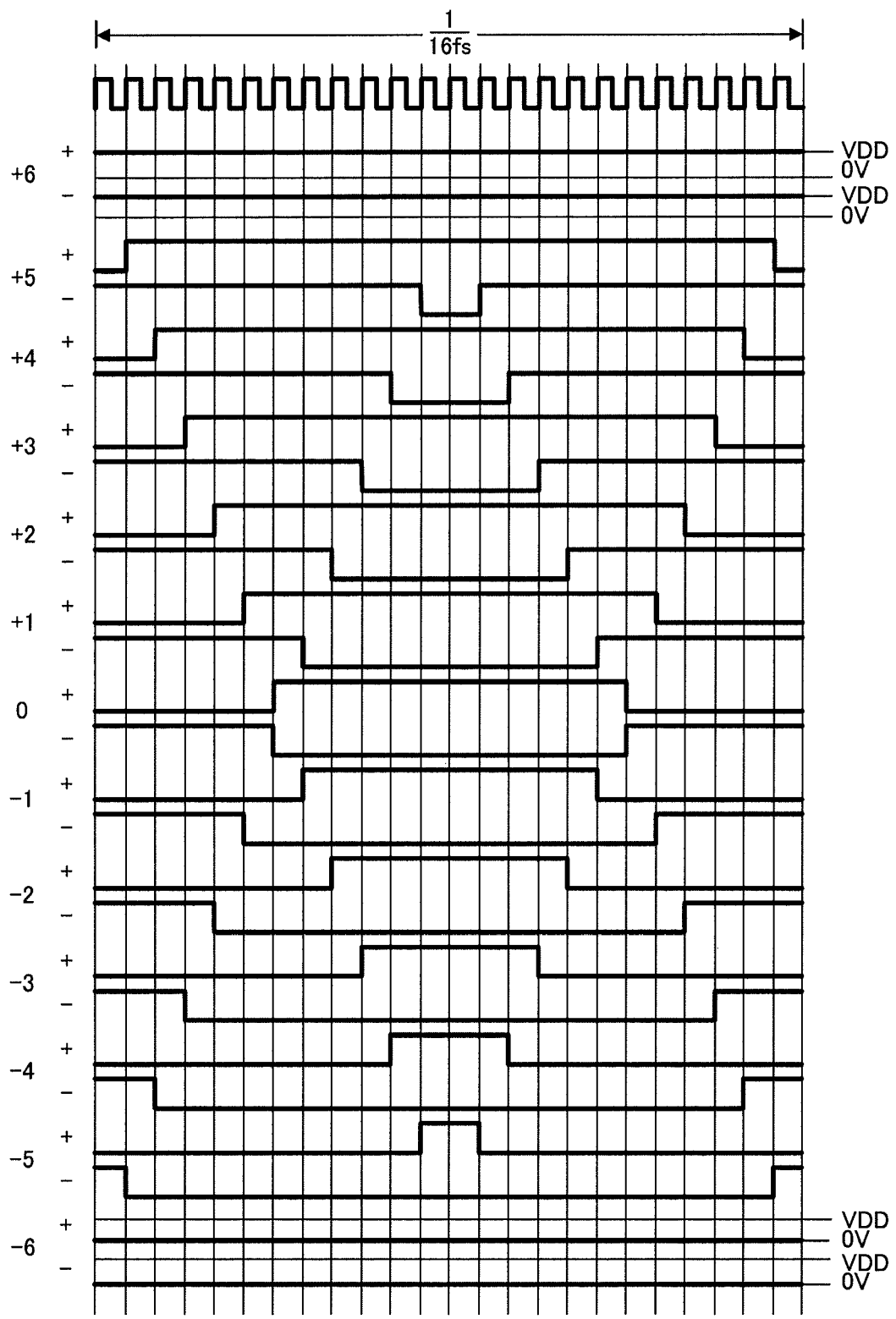
FIG. 10 is a drawing for an explanation of principles showing output waveforms of a PWM circuit handling ±6 value 16 fs.

For example, when a ΔΣ modulation circuit in a stage prior to class D amplifier output stage 100 outputs ±6 (13 values including 0), output of a PWM circuit in a stage subsequent to this ΔΣ modulation circuit has the kind of waveforms shown in FIG. 10.

FIG. 10 is a drawing showing output waveforms of a PWM circuit handling ±6 values, and shows output steps that a PWM wave can take when the sampling rate subsequent to the ΔΣ modulation circuit is 16 fs.

As shown in FIG. 10, at 0 the phases of positive and negative PWM waves are opposite, and take a form such that the duty ratio is disrupted according to the value represented.

Next, secondary effects from the use of the configuration shown in FIG. 6 will be described.

When values represented by positive and negative PWM waves are displaced, a value combined by inductors 111 and 112 is an intermediate value of positive and negative outputs. Therefore, in the case of a PWM circuit that can represent ±6, for example, the number of steps that can be represented by combining can be increased to ±12 (25 values).

That is to say, the number of steps represented by individual PWM waves need only be half the number of steps deemed ultimately necessary, enabling one of the following to be selected as necessary.

Figure 11:
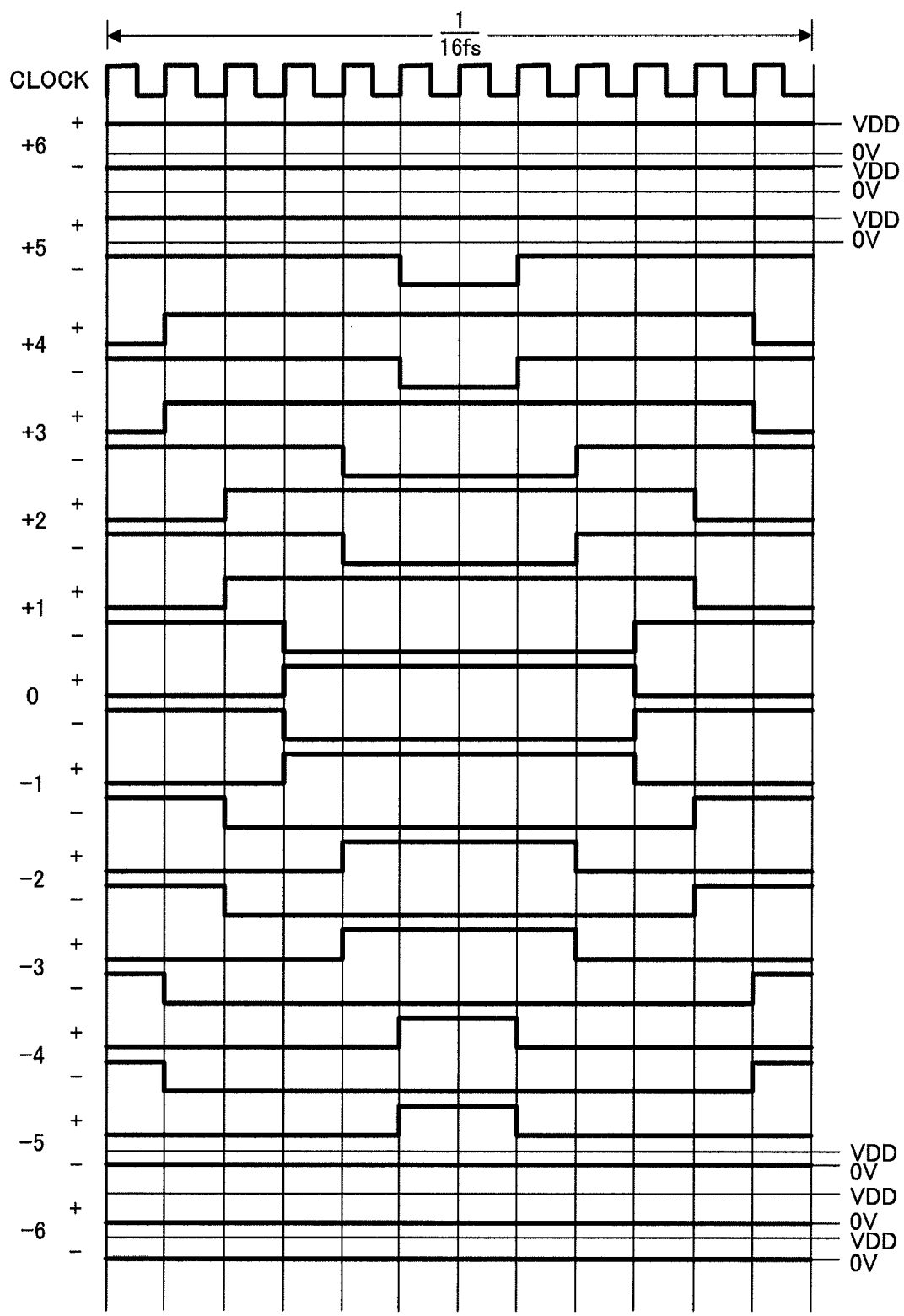
FIG. 11 is a drawing for an explanation of principles showing output waveforms of a PWM circuit handling ±6 value 16 fs at half the clock frequency.

One choice is to lower the clock frequency by half and measure power saving. In FIG. 10, the ΔΣ modulation circuit sampling frequency is [16×fs], and the clock frequency is [384×fs]. If the clock frequency is here lowered by half, ±3 can be represented by PWM circuit output. This PWM output is output as waveforms such as shown in FIG. 11 according to ±6 output by the above ΔΣ modulation circuit. If two positive and negative PWM waves are combined by inductors 111 and 112, ±6 can be represented.

Another choice is to further raise the oversampling multiplying factor and improve the SN ratio.

As in the case described above, the range that can be represented by a single PWM wave is ±3, and ±6 is represented through combining by inductors 111 and 112. When operation is performed at the same clock frequency as in FIG. 10, the sampling frequency of the above ΔΣ modulation circuit is doubled.

Figure 12:
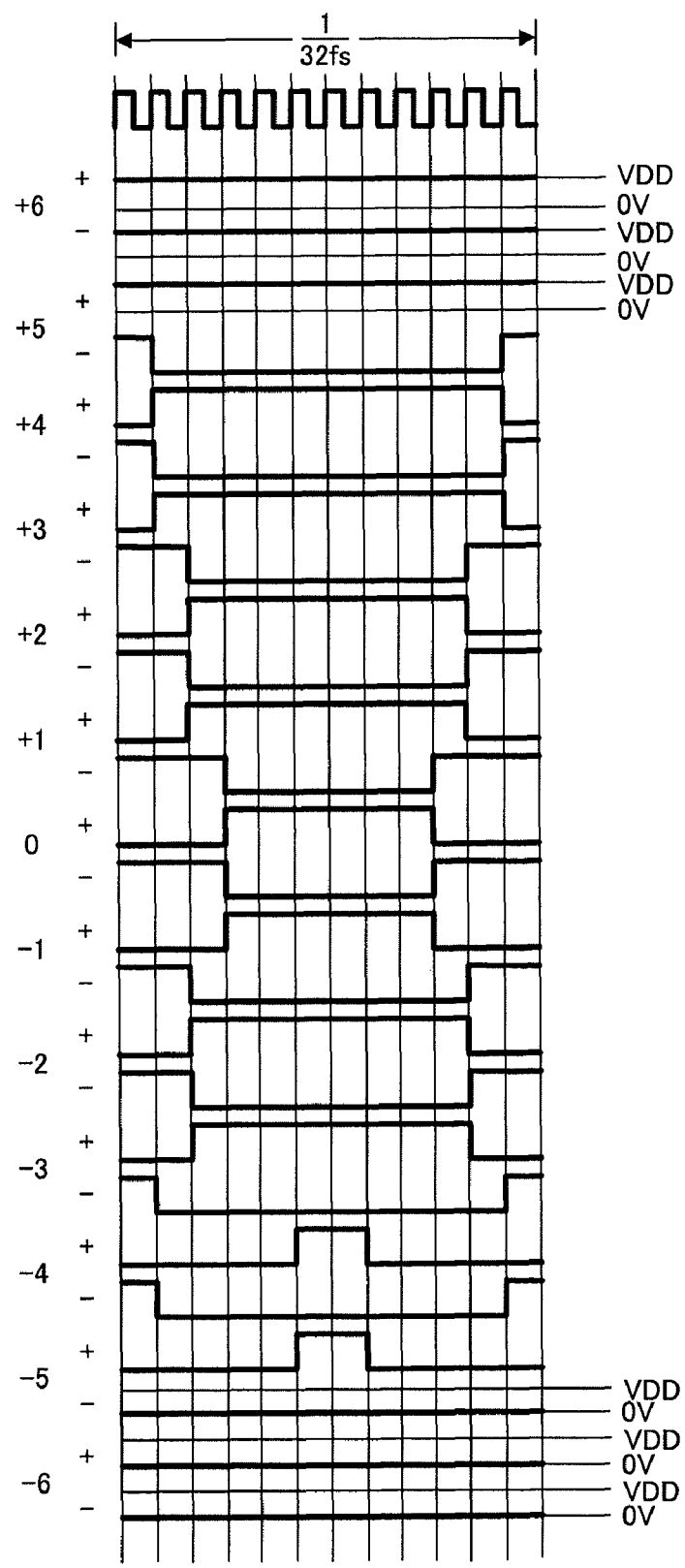
FIG. 12 is a drawing for an explanation of principles showing output waveforms of a PWM circuit handling ±6 value 32 fs at the same clock frequency.

FIG. 12 is a drawing showing output waveforms of a PWM circuit handling ±6 values when the oversampling multiplying factor is made 2.

Representing ±6 through combining by inductors 111 and 112 raises the multiplying factor of oversampling by the above ΔΣ modulation circuit to 2. As a result, the difference between a band in which noise rises in ΔΣ modulation and a desired signal band widens, and therefore the SN ratio improves. This is illustrated in FIG. 13.

Figure 1:
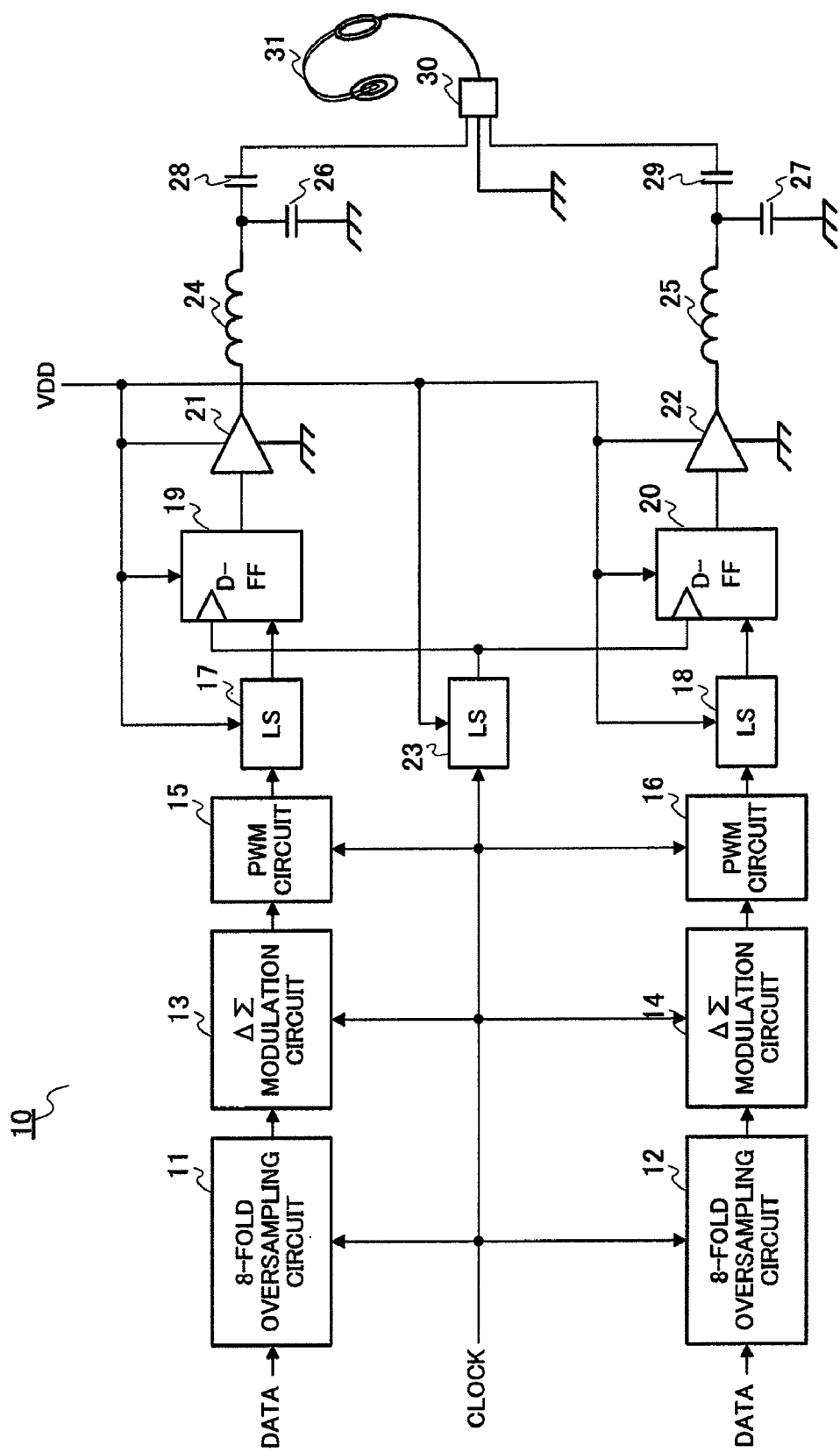
FIG. 1 is a drawing showing the configuration of a class D amplifier when driving conventional stereo headphones.
Figure 2:
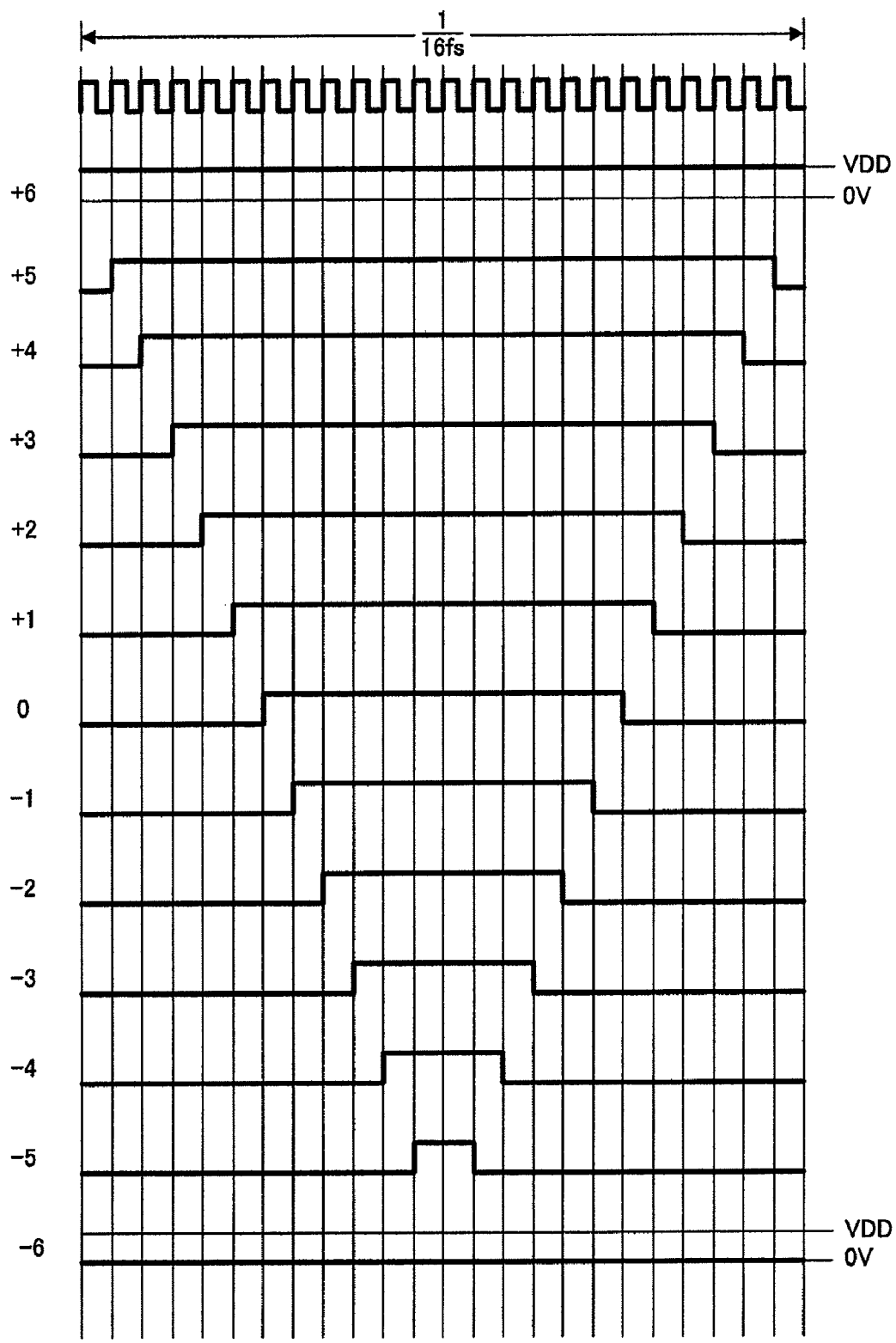
FIG. 2 is a drawing showing output waveforms of a PWM circuit handling conventional ±6 values.
Figure 3:
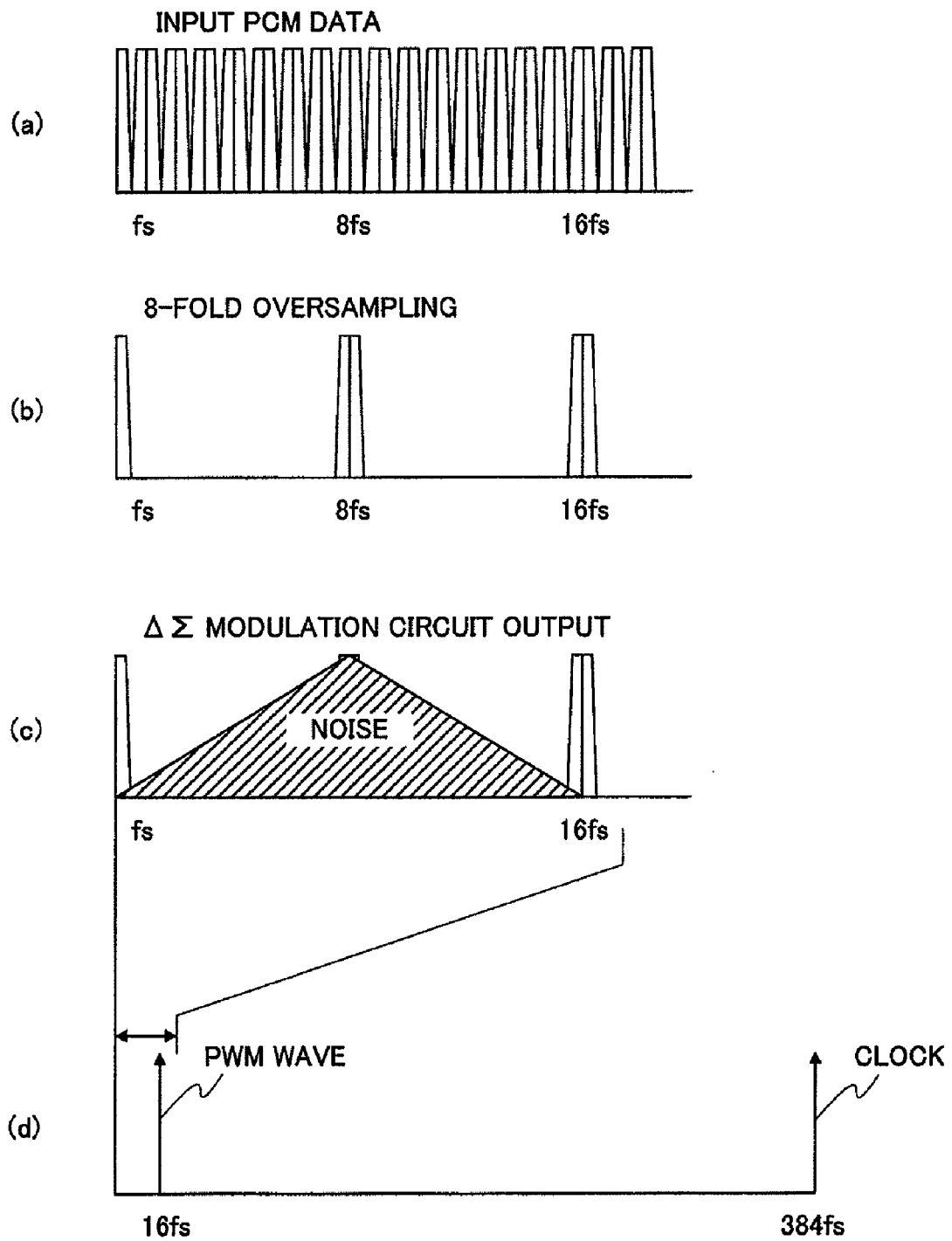
FIG. 3 comprises drawings showing conventional input PCM data, 8-fold oversampling, ΔΣ modulation circuit output, and a PWM wave on the frequency axis.
Figure 4:
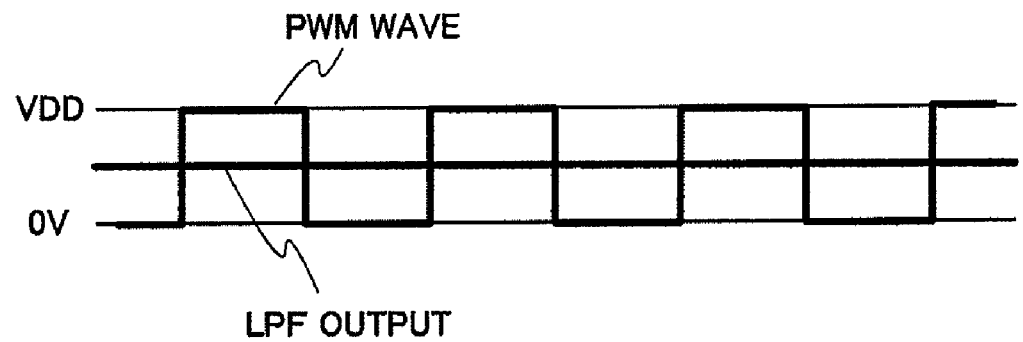
FIG. 4 is a drawing showing a PWM waveform when output of a conventional ΔΣ modulation circuit is 0, and a waveform after passage through an LPF.
Figure 5:
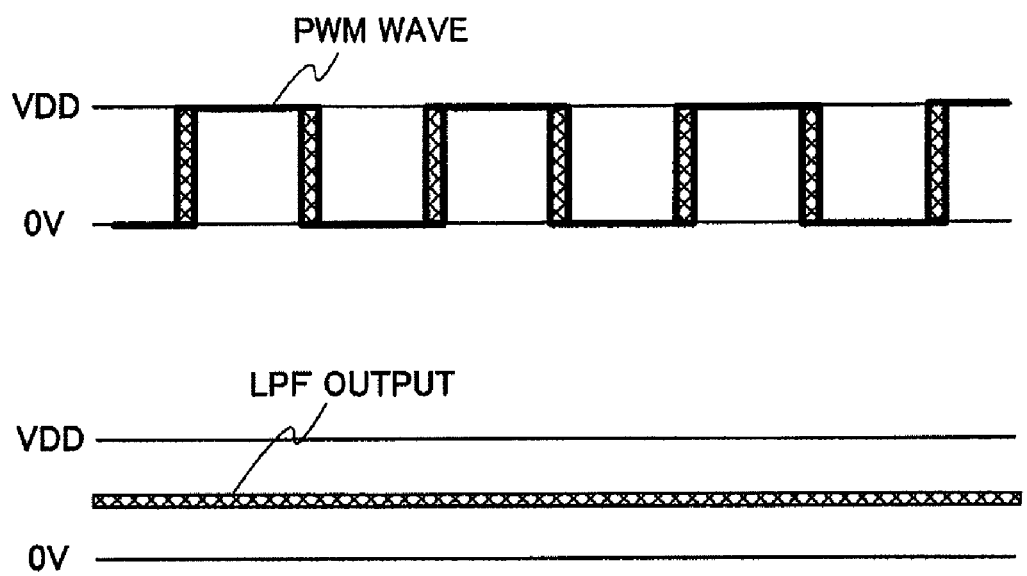
FIG. 5 is a drawing explaining performance degradation of a class D amplifier due to jitter of a conventional operating clock.
Figure 13:
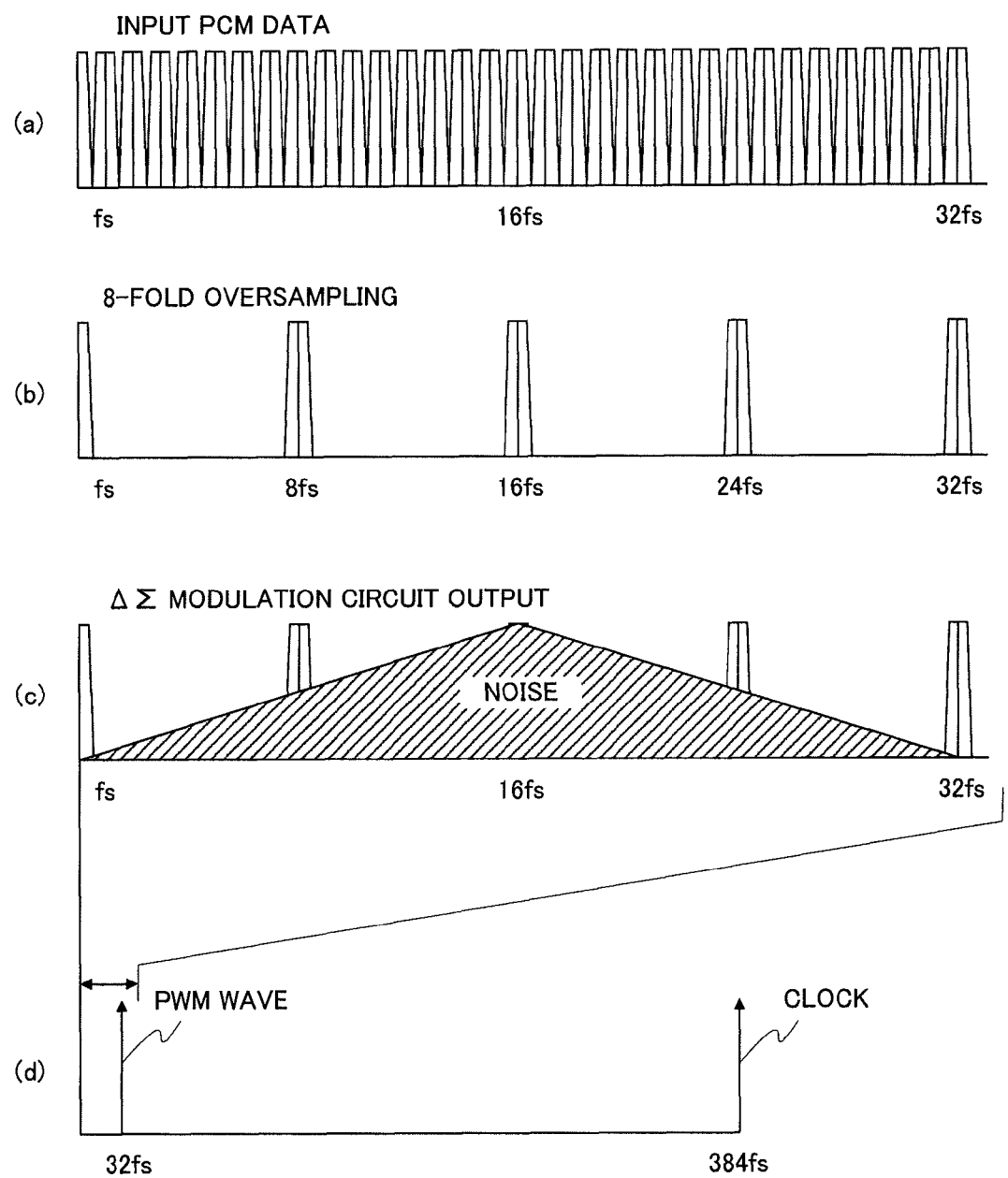
FIG. 13 comprises drawings for an explanation of principles showing input PCM data, 8-fold oversampling, ΔΣ modulation circuit output, and a PWM wave on the frequency axis.

FIG. 13 comprises drawings showing input PCM data, 8-fold oversampling, ΔΣ modulation circuit output, and a PWM wave on the frequency axis. As can be seen by comparing FIG. 13 with above-described FIG. 3, the SN ratio can be improved through the multiplying factor of oversampling by the above ΔΣ modulation circuit becoming 2, and the difference between a band in which noise rises in ΔΣ modulation and a desired signal band widening.

Combining two positive and negative PWM waves by means of inductors 111 and 112 here enables the number of steps that can be represented by a PWM wave to be doubled. The increase in the number of steps due to this inductor combining is not limited to two positive and negative PWM waves, and an increase in the number of steps is also possible by performing combining with a greater number of inductors. For example, if the two positive and negative outputs are increased to four outputs, the number of steps that can be represented can be further increased. However, since there is also an increase in the number of inductors and PWM circuits, combining of two outputs is desirable when efficacy and circuit complexity are taken into consideration.

Embodiment

Figure 14:
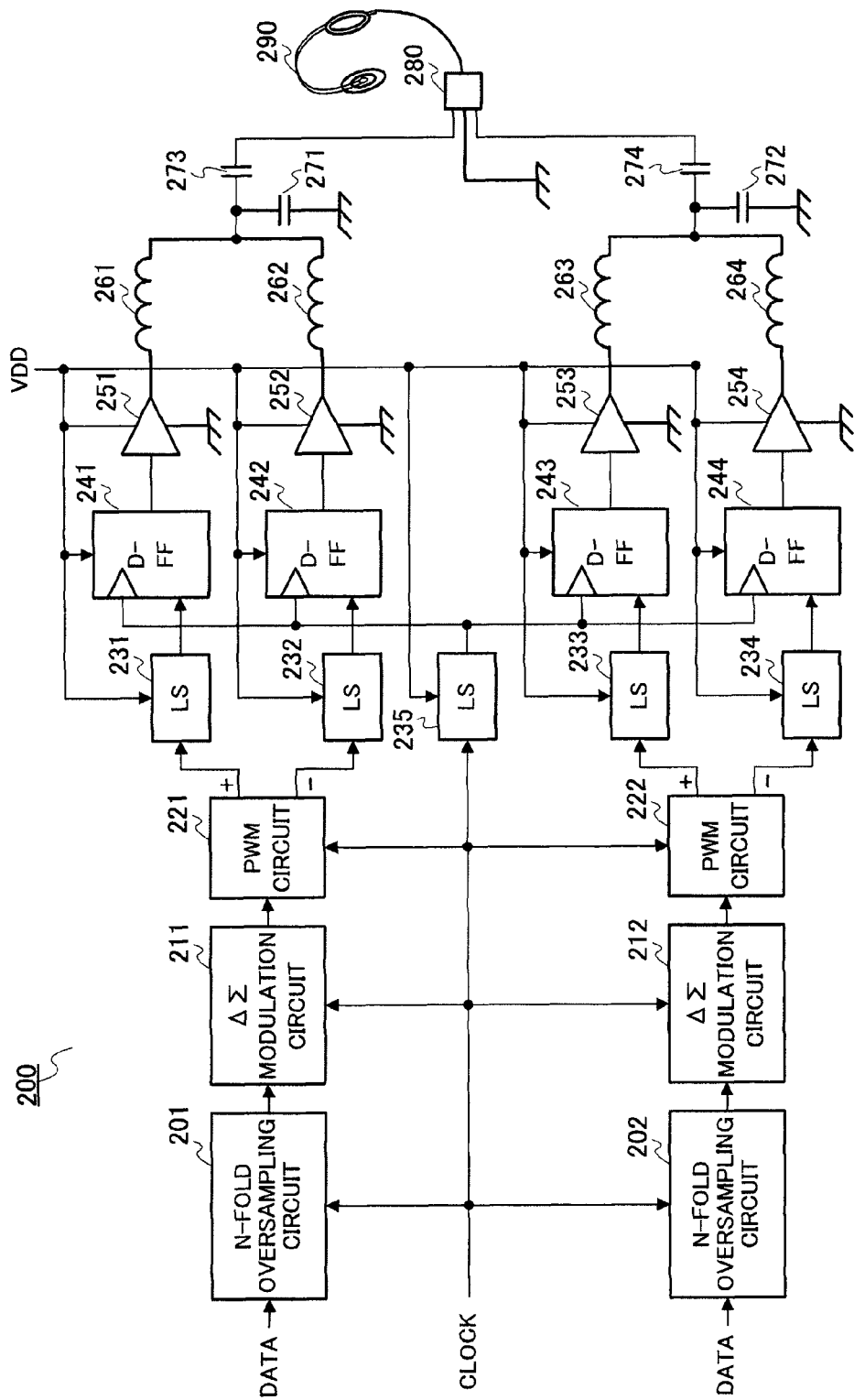
FIG. 14 is a circuit diagram showing the configuration of a class D amplifier according to an embodiment of the present invention.

FIG. 14 is a circuit diagram showing the configuration of a class D amplifier according to an embodiment of the present invention based on the above-described basic concept. This embodiment is an example of application of the present invention to a class D amplifier that drives stereo headphones.

In FIG. 14, class D amplifier 200 is configured by means of N-fold oversampling circuits 201 and 202, ΔΣ modulation circuits 211 and 212, PWM circuits 221 and 222, level shifters (LS) 231 through 235, D flip-flops 241 through 244, PWM output buffers 251 through 254, inductors 261 through 264, capacitors 271 through 274, 3-terminal connector 280, and stereo headphones 290.

PWM circuits 221 and 222 perform PWM modulation of an input signal and output two opposite-phase PWM outputs.

PWM output buffers 251 through 254 amplify PWM circuit 221 and 222 differential outputs respectively using power supply voltage VDD.

Inductors 261 through 264 combine PWM outputs amplified by PWM output buffers 251 through 254.

Class D amplifier 200 has two of each configuration element in order to provide stereo output.

The operation of class D amplifier 200 configured as described above will now be explained. Operation is the same for both channels.

N-fold oversampling circuits 201 and 202 perform N-fold (where N is an arbitrary natural number) oversampling of input PCM data. When the relationship between ΔΣ modulation circuit 211 and 212 outputs and PWM circuit 221 and 222 outputs is as shown in above-described FIG. 10 or FIG. 11, the multiplying factor is 8. In the case of the relationship shown in FIG. 12, the multiplying factor is 16. By this means, input PCM data sampling frequency fs is increased N-fold (here, 8-fold) by N-fold oversampling circuits 201 and 202.

Requantization to ±6 values is performed by next-stage ΔΣ modulation circuits 211 and 212. In this case, sampling frequency fs is increased 2-fold, for a 16-fold increase in original sampling frequency fs. At the same time, requantization and noise shaping processing are performed. At this stage, when above-described FIG. 10 or FIG. 11 is applied, sampling frequency fs is 16 times that of the original data. If FIG. 12 is applied, the figure is 32 times.

PWM circuits 221 and 222 modulate M-ary outputs from ΔΣ modulation circuits 211 and 212 to PWM waves. In this example, ΔΣ modulation circuits 211 and 212 are of M-ary output type, and requantize to ±6—that is, 13—values. PWM circuits 221 and 222 generate PWM waves such as shown in FIG. 10 or FIG. 11, or in FIG. 12.

PWM circuit 221 and 222 outputs are converted by level shifters 231 through 234 to a signal level of circuitry operating at power supply voltage VDD. That is to say, PWM output buffers 251 through 254 PWM operate at power supply voltage VDD, unlike circuitry in the preceding stage. Therefore, PWM circuit 221 and 222 outputs are converted to a potential at which PWM output buffers 251 through 254 operate by means of level shifters 231 through 234. However, the waveform of PWM waves may be disrupted by passage through level shifters 231 through 234. To prevent this, the PWM waves pass through D flip-flops 241 through 244. D flip-flops 241 through 244 operate at the same power supply voltage VDD as PWM output buffers 251 through 254, and therefore potential conversion is also performed for the clock in the same way as for the PWM wave by level shifter 235.

The PWM waves are also shaped with a clock signal by D flip-flops 241 through 244. The PWM waves generated in this way pass through PWM output buffers 251 through 254.

PWM output buffers 251 through 254 are inserted in order to output a current capable of driving a load. PWM output buffer 251 through 254 outputs are at power supply voltage VDD at the high level and 0 V at the low level.

PWM output buffer 251 through 254 outputs are combined by inductors 261 through 264.

Inductor 261 and capacitor 271, inductor 262 and capacitor 271, inductor 263 and capacitor 272, and inductor 264 and capacitor 272, respectively, form LPFs. Then stereo headphones 290 constituting the load are driven via capacitors 273 and 274 that cut off direct current. Regarding the channels of stereo headphones 290, one terminal of 3-terminal connector 280 is grounded and made common, enabling the number of terminals of 3-terminal connector 280 to be kept to three.

As described above, according to this embodiment, class D amplifier 200 is equipped with PWM circuits 221 and 222 that perform PWM modulation of an input signal and output two opposite-phase PWM outputs, PWM output buffers 251 through 254 that amplify differential outputs of PWM circuits 221 and 222 respectively using power supply voltage VDD, and inductors 261 through 264 that combine PWM outputs amplified by PWM output buffers 251 through 254, the class D amplifier output stage is differentialized and positive and negative outputs of PWM circuits 221 and 222 are combined by inductors 261 through 264, enabling effects due to operating clock jitter to be canceled out, and a single-end-output class D amplifier that handles a load such as stereo headphones to be implemented, without using an expensive part such as a crystal resonator or transformer.

Also, since the number of steps of PWM output of PWM circuits 221 and 222 is half the number of steps represented based on values combined by inductors 261 through 264, it is possible to lower the operating clock frequency by half compared with a conventional example. Lowering the operating clock frequency enables power consumption to be reduced, and also has an effect of facilitating unwanted emission countermeasures.

Furthermore, if the same operating clock frequency is used as in a conventional example, the oversampling multiplying factor can be doubled, and the SN ratio of a class D amplifier can be improved.

The above description is an illustration of a preferred embodiment of the present invention, and the scope of the present invention is not limited to this. For example, the above embodiment is an example applied to various kinds of audio apparatuses, but the present invention can also be similarly applied to any kind of device that amplifies sound.

In the above embodiment, the term "class D amplifier" has been used, but this is simply for convenience of description, and terms such as "power amplifier circuit", "class D switching amplifier", and the like may, of course, also be used.

The type, quantity, connection method, and so forth of circuit sections, such as buffers and LPFs, for example, composing an above-described class D amplifier are not limited to those in the above embodiment.

As described above, according to this embodiment, by combining PWM differential outputs by means of inductors, effects due to operating clock jitter can be canceled out, and a single-end-output class D amplifier that handles a load such as stereo headphones can be implemented, without using an expensive part such as a crystal resonator or transformer.

Also, since the number of steps of PWM output is half the number of steps represented based on values combined by inductors, it is possible to lower the operating clock frequency by half compared with a conventional example. Lowering the operating clock frequency enables power consumption to be reduced, and also has an effect of facilitating unwanted emission countermeasures.

Furthermore, if the same operating clock frequency is used as in a conventional example, the oversampling multiplying factor can be doubled, and the SN ratio of a class D amplifier can be improved.

Therefore, a class D amplifier according to the present invention is useful for audio uses whereby power amplification is performed for a PWM signal by means of switching operations in accordance with the PWM signal based on an audio signal or the like, and an output signal thereby obtained is supplied to a load including a speaker or the like. Furthermore, the present invention is not only suitable for application to a class D amplifier in various kinds of audio apparatus, but can also be widely applied to class D amplifiers in electronic devices other than audio apparatuses.

What is claimed is:

1. A class D amplifier, comprising:
   a first pulse width modulation (PWM) circuit that performs PWM of a first input signal and outputs a first PWM signal;
   a second PWM circuit that performs PWM of a second input signal and outputs a second PWM signal comprising an opposite-phase of the first PWM signal;
   a first buffer that amplifies the first PWM signal using a power supply voltage VDD;
   a second buffer that amplifies the second PWM signal using the power supply voltage VDD;
   a combination circuit that combines the first PWM signal amplified by the first buffer and the second PWM signal amplified by the second buffer;
   a capacitor with one terminal grounded; and
   a load with one terminal grounded,
   wherein:
      the combination circuit comprises a first inductor and a second inductor;
      one terminal of the first inductor is connected to a terminal of the first buffer from which the first PWM signal is outputted;
      one terminal of the second inductor is connected to a terminal of the second buffer from which the second PWM signal is outputted;
      an other terminal of the first inductor, an other terminal of the second inductor and an other terminal of the capacitor are connected to form an output terminal, and the first inductor, the second inductor, and the capacitor form a lowpass filter; and
      a value combined in the combination circuit connecting an other terminal of the load to the output terminal is applied to the load.

2. The class D amplifier according to claim 1, wherein a number of steps of the first PWM signal and the second PWM signal is ½ a number of steps represented based on values combined by the first and second inductors.

* * * * *